United States Patent
Dhir et al.

(10) Patent No.: US 9,735,728 B2
(45) Date of Patent: Aug. 15, 2017

(54) FLEXIBLE MODULE CONNECTORS OF FLEXIBLE PHOTOVOLTAIC MODULES

(71) Applicant: Apollo Precision (Kunming) Yuanhong Limited, Kunming, Yunan (CN)

(72) Inventors: Tanya Dhir, Santa Clara, CA (US); Steven Croft, Menlo Park, CA (US)

(73) Assignee: Beijing Apollo Ding Rong Solar Technology Co., Ltd., Beijing (CN)

( * ) Notice: Subject to any disclaimer, the term of this patent is extended or adjusted under 35 U.S.C. 154(b) by 0 days.

(21) Appl. No.: 14/252,246

(22) Filed: Apr. 14, 2014

(65) Prior Publication Data

US 2014/0305493 A1   Oct. 16, 2014

Related U.S. Application Data

(60) Provisional application No. 61/811,389, filed on Apr. 12, 2013.

(51) Int. Cl.
*H02N 6/00* (2006.01)
*H01L 31/042* (2014.01)
(Continued)

(52) U.S. Cl.
CPC ........ *H02S 40/36* (2014.12); *H01L 31/02013* (2013.01); *H02S 40/34* (2014.12); *Y02E 10/50* (2013.01)

(58) Field of Classification Search
CPC .......... H02S 40/34; H02S 40/36; H02S 40/30; H01L 31/02013; H01L 31/0508
See application file for complete search history.

(56) References Cited

U.S. PATENT DOCUMENTS 5,482,569 A * 1/1996 Ihara .............................. 136/251
6,066,796 A * 5/2000 Itoyama ............ H01L 31/02008
                                                                  136/251
(Continued)

FOREIGN PATENT DOCUMENTS

WO   WO 2010014941 A1 *  2/2010

OTHER PUBLICATIONS

Office Action dated Apr. 8, 2016, issued in U.S. Appl. No. 14/252,282.
(Continued)

*Primary Examiner* — Eli Mekhlin
(74) *Attorney, Agent, or Firm* — Weaver Austin Villeneuve & Sampson LLP

(57) ABSTRACT

Provided are flexible photovoltaic modules having flexible module connectors that allow their connector bodies to move with respect to other parts of the modules in one or more directions. This flexibility may be used to align connector bodies during installation. Further, flexibility may help to overcome the thermal expansion differences of various modules and supporting structure components during operation. Flexible arms may be used to support connector bodies with respect to module sealing sheets to provide the necessary flexibility. Such modules may also include various touch safety features to keep conductive elements of the module connectors disconnected from the photovoltaic cells prior to installation of the module and during initial installation operations. Also provided are flexible photovoltaic assemblies, each including multiple modules electrically interconnected with each other and sealed at their interfaces. An assembly may be reconfigured in the field to remove one or more modules from the assembly.

19 Claims, 8 Drawing Sheets

(51) Int. Cl.
*H02S 40/36* (2014.01)
*H01L 31/02* (2006.01)
*H02S 40/34* (2014.01)

(56) References Cited

U.S. PATENT DOCUMENTS

| | | |
|---|---|---|
| 8,158,450 B1 | 4/2012 | Sheats et al. |
| 9,231,123 B1 * | 1/2016 | Sherman ............ H01L 31/02002 |
| 2004/0040619 A1 * | 3/2004 | Dehn ................. B65D 25/2885 |
| | | 141/110 |
| 2005/0061360 A1 * | 3/2005 | Horioka ........................ 136/244 |
| 2006/0054213 A1 * | 3/2006 | Baret .................... H01L 31/048 |
| | | 136/251 |
| 2006/0219291 A1 * | 10/2006 | Hikosaka ...................... 136/251 |
| 2008/0156365 A1 * | 7/2008 | Scholz ........................... 136/251 |
| 2008/0271774 A1 * | 11/2008 | Kalkanoglu ...... H01L 31/02008 |
| | | 136/244 |
| 2009/0114261 A1 | 5/2009 | Stancel et al. |
| 2010/0018135 A1 * | 1/2010 | Croft ....................... H02S 40/32 |
| | | 52/173.3 |
| 2010/0144170 A1 | 6/2010 | Maebashi et al. |
| 2010/0275976 A1 * | 11/2010 | Rubin ........................... 136/251 |
| 2011/0146792 A1 * | 6/2011 | Wu ................................ 136/259 |
| 2011/0232963 A1 * | 9/2011 | Kono ........................... 174/70 R |
| 2012/0152349 A1 | 6/2012 | Cao et al. |
| 2012/0291845 A1 | 11/2012 | Hatakeyama et al. |
| 2013/0169056 A1 | 7/2013 | Sherman et al. |
| 2014/0305494 A1 | 10/2014 | Dhir |
| 2014/0305495 A1 | 10/2014 | Krajewski |

OTHER PUBLICATIONS

Final Office Action dated Jan. 6, 2017, issued in U.S. Appl. No. 14/252,282.

Office Action dated Aug. 12, 2016, issued in U.S. Appl. No. 14/252,321.

\* cited by examiner

FLEXIBLE MODULE CONNECTORS OF FLEXIBLE PHOTOVOLTAIC MODULES

CROSS-REFERENCE TO RELATED APPLICATION

This application claims the benefit of priority to U.S. Provisional Application No. 61/811,389, titled "FLEXIBLE MODULE CONNECTORS OF FLEXIBLE PHOTOVOLTAIC MODULES," filed Apr. 12, 2013, all of which is incorporated herein by reference in its entirety and for all purposes.

BACKGROUND

Photovoltaic technology is being rapidly adopted to generate electricity from solar energy, both for local uses and for supplying power to electrical grids. Photovoltaic systems may be implemented on vehicles, buildings, or as standalone photovoltaic arrays. Photovoltaic cells are the basic units of such systems. One or more photovoltaic cells are typically arranged into a photovoltaic module, which may be then used to form a photovoltaic array.

SUMMARY

Provided are flexible photovoltaic modules having flexible module connectors that allow their connector bodies to move with respect to other parts of the modules in one or more directions. This flexibility may be used to align connector bodies during installation. Further, flexibility may help to overcome the thermal expansion differences of various modules and supporting structure components during operation. Flexible arms may be used to support connector bodies with respect to module sealing sheets to provide the necessary flexibility. Flexible photovoltaic modules may also include various touch safety features to keep conductive elements of the module connectors disconnected from the photovoltaic cells prior to installation of the module and during initial installation operations. Also provided are flexible photovoltaic assemblies, each including multiple modules electrically interconnected with each other and sealed at their interfaces. An assembly may be reconfigured in the field to remove one or more modules from the assembly.

These and other embodiments are described further below with reference to the figures.

DETAILED DESCRIPTION OF EXAMPLE EMBODIMENTS

Figure 1A:
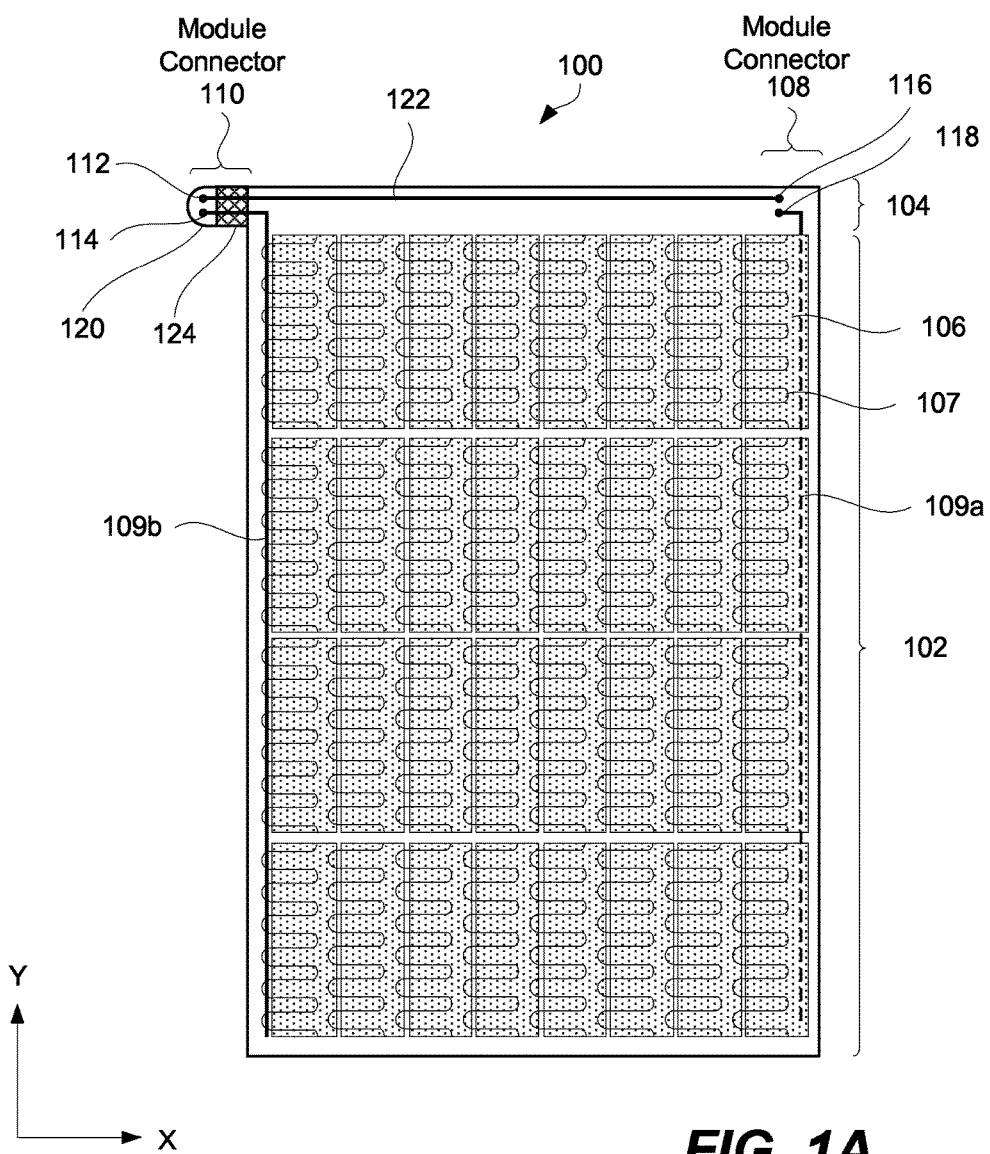
FIGS. 1A and 1B are top and side schematic views of a flexible photovoltaic module having a flexible module connector, in accordance with certain embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

Flexible photovoltaic modules are made of flexible materials that allow these modules to bend and conform to various non-planar installation surfaces. Such modules can include two flexible sealing sheets and a set of flexible photovoltaic cells sealed between these sheets. Flexible modules may be easier to handle and install than their rigid glass counterparts. For example, flexible modules are less susceptible to damage when dropped or stepped on. Further, such modules may be positioned directly onto supporting surfaces without any intermediate mounting hardware. Flexible materials used for constructing photovoltaic modules may be easier to cut or otherwise shape to fit these modules into available installation areas. Flexible sealing sheets may be bonded directly to various installation surfaces, such as rooftop polymer membranes, and may be used for additional protection of these surfaces after installation. Further, a new sealed space formed between the installation surface and flexible module may be used to house and protect various components of the photovoltaic array, such as connectors, lines, interferers, converters, and the like.

New designs and characteristics of flexible photovoltaic modules allow various new photovoltaic applications of these modules, which may have not been previously available with conventional rigid modules. For example, flexible modules may be used on substantially horizontal rooftops, which are common on commercial buildings. Unlike the sloped rooftops of residential buildings, these horizontal rooftops use different roofing materials and may be subjected to different environmental conditions. For example, flat horizontal rooftops tend to accumulate and retain some water and/or snow. Freezing and thawing cycles may cause substantial mechanical stresses exerted on rooftop structures. Further, flat rooftops may have greater temperature fluctuations because of different materials used for their constructions. Flat roofs are often used as walkways to access different parts of the roof and, therefore, rooftop membranes and even some structures positioned over such membranes may need to withstand some foot traffic.

At the same time, some of these new characteristics and applications may result in specific design considerations. For example, flexible sealing sheets may be directly bonded to supporting surfaces, as further explained below. Various materials combined into such systems may have significant differences in coefficient of thermal expansion (CTE) and such differences may be more important because of tight coupling of these systems. CTE differences may cause substantial mechanical stress on electrical connections and other attachments of flexible photovoltaic modules. Flexibility of the module itself may not be sufficient to accommodate such stresses.

Provided are flexible photovoltaic modules having flexible module connectors. These module connectors include connector bodies that are flexibly attached to other parts of the modules and that can move in one or more directions and/or rotate around one or more axes with respect to these other parts. Flexible attachment may be provided by flexible arms and/or some other flexible features, such as flexible coupling between an arm and one or more sealing sheets. Some flexibility may also be provided by the sealing sheets. For example, one or both sealing sheets may form a connector flap that may be substantially more flexible than portions of the module enclosing photovoltaic cells. In certain embodiments, one or both sealing sheets may be used in at least some parts of the flexible arm, such as its insulating sheath.

Flexible materials may be used for constructing at least some portions of such flexible module connectors (for example, their flexible arms). For example, one or more stranded wires may be used for a flexible arm. These stranded wires may be enclosed in and insulated by a flexible polymer sheath. Furthermore, at least some portions of the flexible module connectors may be shaped to provide additional flexibility. For example, in certain embodiments, a flexible arm may be shaped as a ribbon having waves extending in a direction substantially perpendicular to the sealing sheets. In the same or other embodiments, a flexible arm may have a loop shape within a plane substantially parallel to the sealing sheets.

In some embodiments, a connector body flexibly attached to other supporting components of the module may itself be rigid. Rigidity of the connector body may be used to provide better support to conductive elements supported by and, in certain embodiments, housed within the module connector. Rigidity may also help to provide better alignment with respect to other connectors (for example, in order to maintain electrical and mechanical connections with respect to these other components).

One or more conductive elements of a connector body may be provided within cavities provided in that body that are substantially perpendicular to the sealing sheets of the flexible photovoltaic module after installation of the module. This orientation of the cavities may help with retaining the electrical connections established by these conductive elements since most of the stress generated by the CTE differences is likely to be in the directions substantially parallel to the sealing sheets. Further, this orientation of the cavities may facilitate making electrical connections by applying a downward force substantially perpendicular to the sealing sheets and the rooftop or other supporting surface. For example, an installer may step on the connector body during installation to form mechanical and electrical connections with another component, such as another module connector, jumper connector, inverter, or the like.

Conductive elements of the module connector may be sealed from the environment by providing various seals on the connector bodies. Furthermore, an entire flexible photovoltaic module may be used as a seal. For example, a module connector may be positioned between the back side of the module and a supporting surface such as a rooftop membrane. When the module is sealed to this surface during installation, the seal also protects the module connector and electrical connections provided by the connector.

Electrical safety may be provided by keeping conductive elements initially disconnected from photovoltaic cells and, in certain embodiments, from return lines provided within flexible photovoltaic modules. Therefore, there is no voltage applied to the conductive elements even if photovoltaic cells are exposed to light prior to or during installation. At some point during installation, the connection may be established. However, at this point, the conductive elements are generally not accessible to installers. These safety features are sometimes referred to as touch safety features and may be provided in a variety of ways. For example, a flexible photovoltaic module may include an electronic control unit responsible for connecting conductive elements to the photovoltaic cells after, for example, receiving a predetermined signal. In the same or other embodiments, a flexible photovoltaic module may include a junction box for installing or configuring bridging connectors and, as a result, establishing electrical connections between the cells and conductive leads. Furthermore, conductive elements may be hidden within insulating enclosures in addition to or instead of keeping the conductive elements disconnected from the cells. These insulating enclosures prevent people from accidently touching the conductive elements during handling and installation of the modules.

Flexible photovoltaic modules may be attached to building structures and other supporting structures in a variety of ways. For example, a flexible photovoltaic module may be positioned on a flat rooftop having a polymer sealing membrane, including one or more polymers such as ethylene propylene diene monomer (EPDM), chlorosulfonated polyethylene (CSF), polyvinyl chloride (PVC), and thermoplastic polyolefin (TPO). The module may be sealed with respect to the membrane to prevent water and other environmental objects from getting in between the module and membrane. For example, a module may be welded, glued, or otherwise attached to the sealing membrane around the perimeter of the module.

Flexible Photovoltaic Modules

Figure 1B:
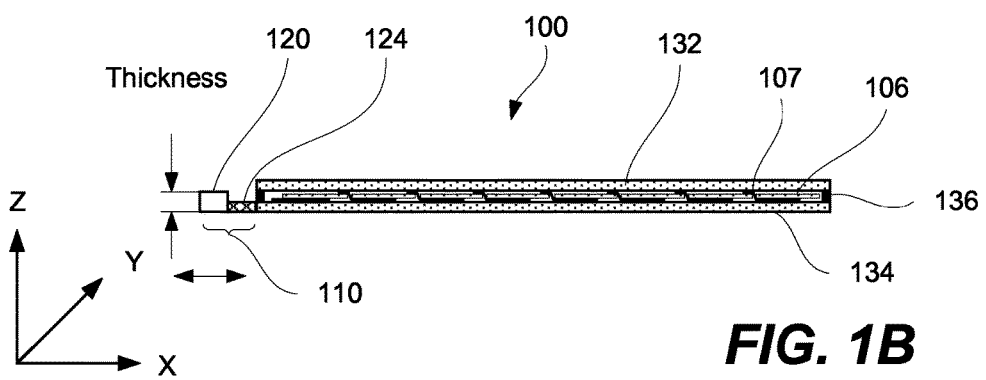

A brief description of flexible photovoltaic modules is presented below to provide some context of various flexible module connector features. Specifically, FIGS. 1A and 1B are schematic top and side views of flexible photovoltaic module 100 having flexible module connector 110, in accordance with certain embodiments. Module 100 includes two flexible sealing sheets, front side flexible sealing sheet 132 and back side flexible sealing sheet 134. Together, flexible sealing sheets 132 and 134 seal one or more flexible photovoltaic cells 106 between the sheets. The space enclosed by the flexible sealing sheets 132 and 132, in which the photovoltaic cells 106 are disposed, may be referred to as sealed space 102. In certain embodiments, one or both flexible sealing sheets 132 and 134 may extend beyond the sealed space 102 to form, for example, connector flap 104. In other embodiments, boundaries of flexible sealing sheets 132 and 134 may coincide with boundaries of sealed space 102. Furthermore, a portion of sealed space 102 and/or one or more flaps extending outside of sealed space 102 may be used for attaching flexible photovoltaic module 100 to other structures, such as roof sealing membranes. In certain embodiments, edge portions of flexible sealing sheets 132 and 134 may be cut after installation to remove the module from the supporting structure without damaging the supporting structure or photovoltaic cells 106. The edge portions remaining after cutting and removal of the module may be used for reattaching the module to another supporting structure. In certain embodiments, the remaining edge portions may be extended by adding new flaps to these portions.

Photovoltaic cells 106 in module 100 are flexible photovoltaic cells. Examples of flexible photovoltaic cells include copper indium gallium selenide (CIGS) cells, cadmium-telluride (Cd—Te) cells, amorphous silicon (a-Si) cells, micro-crystalline silicon (Si) cells, crystalline silicon (c-Si) cells, gallium arsenide (GaAs) multi junction cells, light adsorbing dye cells, organic polymer cells, and other types of photovoltaic cells. A photovoltaic cell typically has a photovoltaic layer that generates a voltage when exposed to light. The photovoltaic layer may be positioned adjacent to a back conductive layer, such as a thin flexible layer of molybdenum, niobium, copper, and/or silver. The photovoltaic cell may also include a flexible conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils). The photovoltaic cell may also include a top flexible conductive layer. This layer typically includes one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers and 1,000 nanometers or, more specifically, about 200 nanometers and 800 nanometers.

Photovoltaic cells 106 may be interconnected using one or more wire networks 107. A wire network 107 may extend over a front side of one cell as well as over a back side of another adjacent cell to interconnect these two cells in series as shown in FIGS. 1A and 1B. Module 100 is shown to have four sets of photovoltaic cells 106. Each set includes eight cells interconnected in series by wire networks 107. The four sets are interconnected in parallel by bus bars 109a and 109b. Bus bars 109a and 109b are connected to conductive elements 114 and 118, respectively. One having ordinary skill in the art would understand that different numbers of photovoltaic cells and different interconnections schemes may be used for flexible photovoltaic modules. The example shown in FIGS. 1A and 1B is for illustrative purposes only and is not limiting for other photovoltaic modules.

Flexible sealing sheets 132 and 134 may include flexible materials such as polyethylene, polyethylene terephthalate (PET), polypropylene, polybutylene, polybutylene terephthalate (PBT), polyphenylene oxide (PPO), polyphenylene sulfide (PPS) polystyrene, polycarbonates (PC), ethylene-vinyl acetate (EVA), fluoropolymers (e.g., polyvinyl fluoride (PVF), polyvinylidene fluoride (PVDF), ethylene-terafluoethylene (ETFE), fluorinated ethylene-propylene (FEP), perfluoroalkoxy (PFA) and polychlorotrifluoroethane (PCTFE)), acrylics (e.g., poly(methyl methacrylate)), silicones (e.g., silicone polyesters), and/or PVC, as well as multilayer laminates and co-extrusions of these materials. A typical thickness of a sealing sheet is between about 5 mils and 100 mils or, for example, between about 10 mils and 50 mils. In certain embodiments, a back side sealing sheet includes a metallized layer to improve its water permeability characteristics. For example, a metal foil may be positioned in between two insulating layers to form a composite back side sealing sheet.

In certain embodiments, flexible photovoltaic module 100 has an encapsulant layer positioned between front side sealing sheet 132 and photovoltaic cells 106. Another encapsulant layer may be provided between back side sealing sheet 134 and photovoltaic cells 106. Examples of encapsulant layer materials include non-olefin thermoplastic polymers or TPO, such as polyethylene (e.g., a linear low density polyethylene), polypropylene, polybutylene, PET, PBT, polystyrene, polycarbonates, fluoropolymers, acrylics, ionomers, silicones, and combinations thereof.

Flexible photovoltaic module 100 may also include edge seal 136 that surrounds photovoltaic cells 106 and forms a sealed space with flexible sealing sheets 132 and 134. Edge seal 136 may prevent moisture from penetrating towards cells 106. Edge seal 136 may be made from certain organic or inorganic materials that have low inherent water vapor transmission rates. In certain embodiments, edge seal 136 is configured to absorb moisture from inside the module in addition to protecting the module from moisture ingression. For example, a butyl-rubber containing moisture getter or desiccant may be used to form edge seal 136. In certain embodiments, a portion of the edge seal 136 that contacts electrical components (e.g., bus bars) of module 100 is made from a thermally resistant polymeric material. Edge seal 136 may be also used to secure front side sealing sheet 132 with respect to back side sealing sheet 134. In certain embodiments, edge seal 136 determines boundaries of sealed space 102.

Flexible Module Connector

As stated above, flexible photovoltaic module 100 includes flexible module connector 110. In certain embodiments, a flexible module connector 110 includes a connector body 120 flexibly attached to other supporting components of module 100. In certain embodiments, module connector 110 includes flexible arm 124 providing a flexible attachment to connector body 120. Supporting components may include back side sealing sheet 134 and/or front side sealing sheet 132. In certain embodiments further described below, a flexible arm may be attached to a header structure that is supported by one or more flexible sheets.

Figure 2:
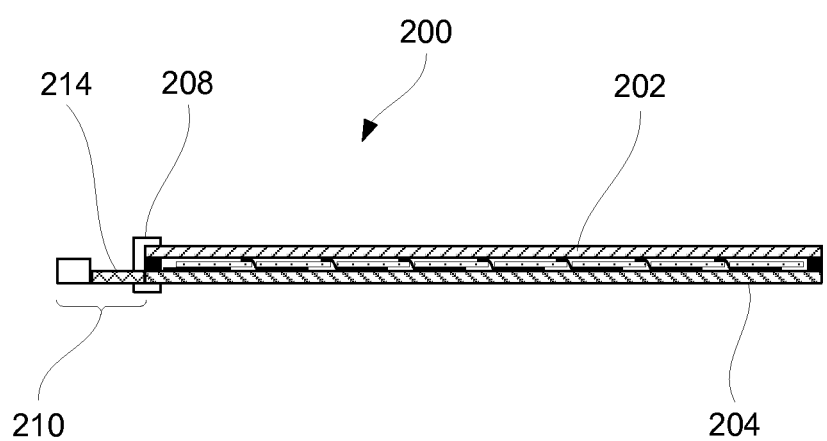
FIG. 2 is a side schematic view of another flexible photovoltaic module having a flexible module connector attached to the header structure, in accordance with certain embodiments.

FIG. 2 is a side schematic view of flexible photovoltaic module 200 having flexible module connector 210 attached to header structure 208, in accordance with certain embodiments. Header structure 208 may be used to protect edges of front side and back side sealing sheets 202 and 204, respectively, in addition to supporting module connector 210. As shown in the figure, header structure 208 may overlap with sealing sheets 202 and 204 such that both sealing sheets 202 and 204 at least partially protrude into header structure 208. In the same or other embodiments, header structure 208 may overlap with module connector 210. For example, in FIG. 2 header structure 208 overlaps with flexible arm 214 of module connector 210. Such an overlap may be formed by molding header structure 208 over sealing sheets 202 and 204 and/or flexible arm 214 of module connector 210. The overlap may help to strengthen attachment between the respective components. Header structure 208 may be made from one or more rigid materials further described below.

Returning to FIG. 1A, connector body 120 may be used to support one or more conductive elements, one of which may be electrically connected to photovoltaic cells. FIG. 1A illustrates conductive elements 112 and 114 provided in connector body 120. Conductive element 114 is electrically connected to flexible photovoltaic cells 106 by bus bar 109b. Conductive element 112 is connected to return line 122, which may extend to another connector as explained further below. In other embodiments (not shown), a connector body may include only one conductive element, which may be electrically connected to the photovoltaic cells or the return line. In further embodiments (not shown), a connector body may include three or more conductive elements, one of which may be connected to photovoltaic cells, while the remaining conductive elements may be connected to multiple return lines.

Flexible arm 124 may be used to provide flexible attachment of connector body 120 to other supporting components of flexible photovoltaic module 100. Connector body 120 and, in certain embodiments, a portion of flexible arm 124 or the entire flexible arm 124 may extend outside of the boundaries defined by sealed space 102. For example, FIG. 1A illustrates module connector 110 attached to connector flap 104, which is not a part of sealed space 102. In other embodiments, attachment of module connector 110 may be within boundaries of sealed space 102. Furthermore, the entire module connector may be positioned within boundaries of sealed space 102. In all these embodiments, connector body 120 may still move with respect to the point of attachment to the sealing sheet(s) or other supporting component of flexible photovoltaic module 100.

Connector body 120 may move in one or more directions and rotate with respect to one or more axes with respect to other components that support connector body 120 (e.g., front side flexible sealing sheet 132 and/or back side flexible sealing sheet 134). For example, connector body 120 may move at least within a plane either defined by or parallel to back side flexible sealing sheet 134. In one example, connector body 120 may move toward and away from its attachment point (e.g., in the X direction in FIGS. 1A and 1B). In the same or other embodiments, connector body 120 may move in other directions within the plane parallel to back side flexible sealing sheet 134 (e.g., in the Y direction). Connector body 120 may also move in the direction substantially perpendicular to sealing sheets 132 and 134 (in the Z direction shown in FIG. 1B). When this motion is coupled with motions in other directions (e.g., in the X direction), connector body 120 may be viewed as rotating or swinging with respect to the attachment point. The amplitude of these motions may be at least about 0.5 millimeters or, for example, at least about 1 millimeter or, even at least about 2 millimeters in each one of the described directions.

Flexible arm 124 may be permanently attached to components of flexible photovoltaic module 100 that support flexible arm 124 and other components of the connector, such as back side sealing sheet 134. In these embodiments, one or more conductive leads extending through flexible arm 124 may extend into these other supporting components of the module. In some embodiments, these conductive leads may form monolithic bodies with bus bars extending into sealed portion 102. A monolithic body, including a conductive lead and bus bar, may be formed from a single conductive strip or wire or otherwise have an integral physical body that is not assembled from separate components. In the same or other embodiments, permanent attachment of flexible arm 124 may be provided by integration of an insulating sheath of flexible arm 124 with other insulating components, such as back side sealing sheet 134, front side sealing sheet 132, and/or header structure further described below. In other embodiments, a flexible arm and the entire module connector may be separable from the supporting components. Addition description of insulating sheaths and conductive leads is presented below.

Despite its flexibility, flexible arm 124 may be configured to maintain a predetermined shape and/or position of connector body 120 with respect to the supporting module components until some minimum predetermined force is applied to connector body 120 causing it to move from the predetermined position. For example, a certain minimum predetermined stiffness may be used to maintain alignment of connector body 120 during installation of flexible photovoltaic module 100 and make electrical connections to conductive elements of connector body 120. Connector body 120 may still move when a force exceeding the predetermined force is applied to connector body 120. Such an excessive force may be applied during installation of the module to move connector body 120 and/or during operation, for example, to accommodate CTE differences.

Additional Module Connectors

In addition to one flexible module connector, a flexible photovoltaic module may include one or more other module connectors. These other connectors may or may not be flexibly attached. Specifically, FIG. 1A illustrates module 100 having module connector 108 positioned within boundaries of connector flap 104. Module connector 108 may not be flexible with respect to its attachment to connector flap 104. Furthermore, the entire connector flap 104 may or may not be flexible with respect to sealed space 102. Additional module connectors may be positioned within the boundaries of one or both sealing sheets 132 and 134. In some embodiments (not shown), a module connector may be positioned within boundaries of sealed area 102.

Module connector 108 includes conductive elements 116 and 118. Conductive elements 116 and 118 may be supported by materials forming connector flap 104. In other embodiments, conductive elements 116 and 118 are supported by a connector body, which may be rigidly attached to connector flap 104 or other supporting components.

Conductive element 116 is shown connected to return line 122 and, therefore, is in electronic communication with conductive element 112 of flexible module connector 110. Conductive element 118 is shown connected to cells 106. Conductive element 114 of flexible module connector 110 is also connected to cells 106, but conductive elements 114 and 118 have different polarities. In certain embodiments (not shown), two conductive elements of the same module connector (flexible or not) are both connected to photovoltaic cells and have different polarities. In these embodiments, the module may have only one connector.

Flexible Arm Designs

Figure 3A:
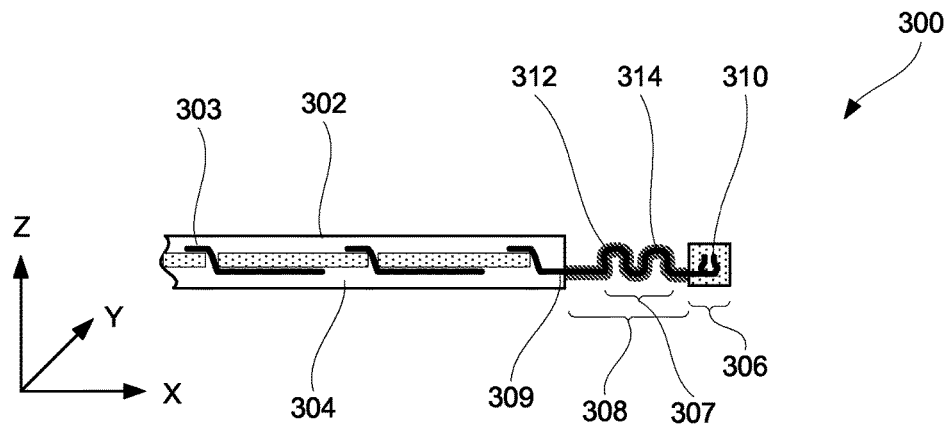
FIGS. 3A and 3B are side and perspective schematic views of a flexible module connector illustrating various electrical components of these connectors, in accordance with certain embodiments.
Figure 3B:
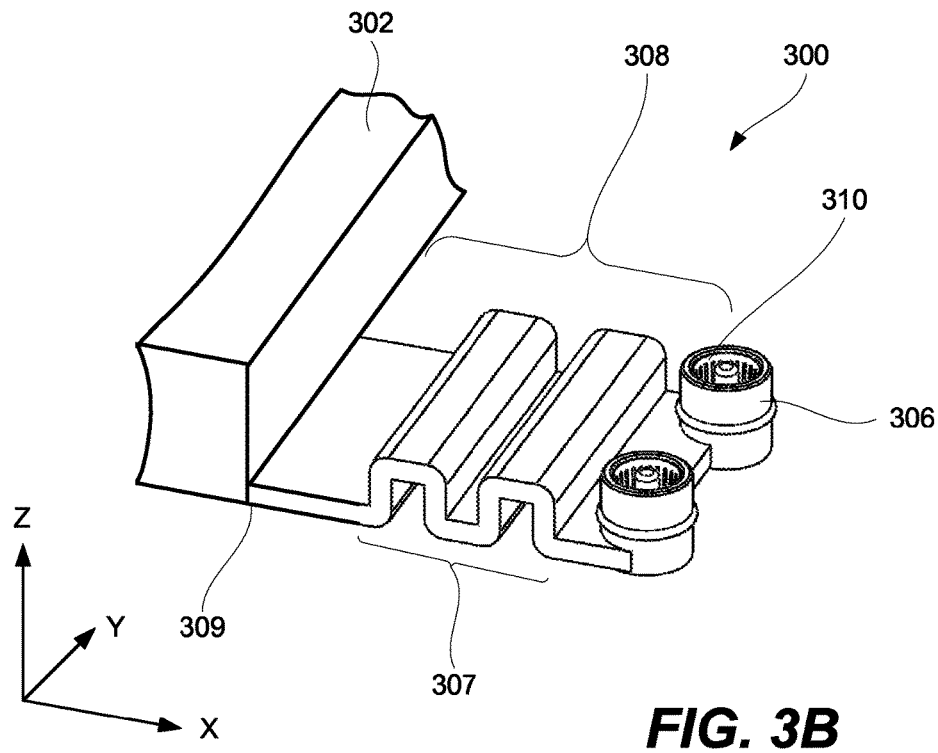

Flexibility of the module connector may be achieved by specifically shaping the flexible arm and/or using specific flexible materials. FIGS. 3A and 3B are side and perspective schematic views of flexible module connector 300, in accordance with certain embodiments. A portion of flexible photovoltaic module 302 is also shown to provide some reference to the orientation and other features of this connector. Module connector 300 is shown to include flexible arm 308 and connector body 306. Connector body 306 houses one or more conductive elements 310, which may be electrically connected to photovoltaic cells, return lines, and/or some other electrical components provided within module 302. Such electrical connections may be provided by one or more flexible conductive leads 314 of flexible arm 308. In specific embodiments, a conductive lead provides electrical connection between a conductive element of the connector body and one or more photovoltaic cells. In the same or other embodiments, a conductive lead interconnects a conductive element and return line.

Flexible conductive lead 314 may be made from one or more conductive materials and may have sufficient conductivity to support electrical currents generated by one or more flexible photovoltaic modules of the module. In certain embodiments, flexible conductive lead 314 has a cross-sectional area of at least about 0.5 millimeter-square or, more specifically, of at least about 1.0 millimeter-square or, even more specifically, of at least about 1.5 millimeter-square. Flexible conductive lead 314 may be rated to carry an electrical current of at least about 10 Amperes or, more specifically, at least about 20 Amperes or, even more specifically, of at least about 30 Amperes. Materials used for flexible conductive lead 314 may include copper, aluminum, nickel, silicon, beryllium, tin, tellurium, silver, phosphorous, cobalt, iron, zinc, chromium, zirconium, magnesium, titanium, and combinations thereof. Flexible conductive lead 314 could be formed (e.g., stamped) from the same conductive substrate as conductive element 310 and, in certain embodiments, other conductors to form a monolithic structure. For example, a progressive die may be used to create louvers, bends, and barrel shapes on and from the same metal strip. Such fabrication techniques can eliminate a need for subsequent interconnections.

Conductive element 310 is used to form an electrical connection with another corresponding conductive element during installation of the flexible photovoltaic module. Conductive element 310 may be housed in a cavity formed within connector body 306 such that the cavity has an opening providing access to conductive element 310. The cavity may extend substantially perpendicular to the sealing sheets (e.g., the back side sealing sheet). Such an orientation of the cavity may help to reduce the risk of disconnecting conductive element 310 from the other element after installation, as explained above.

Conductive element 310 may be formed as louvered metal strips or, more generally, as components with spring-type features. The spring-type features may be parts of contact elements and extend into cavities formed by the contact elements. The term "louvered sockets" may refer to sockets having protrusions spaced apart and extending into the sockets' cavities. When a pin is inserted into such a socket cavity during installation, the spring-type features of the "louvered socket" are pushed outwards and exert a force on the inserted pin. In turn, this force may result in a lower electrical contact resistance than, for example, contacts that do not have such spring-type features. A contact element with spring-type features may be made as a separate component and then connected to an electrical lead or, alternatively, formed as a part of the overall conductor.

Conductive lead 314 may be insulated by flexible insulating sheath 312. Materials for sheath 312 may include polyethylene, polypropylene, thermoplastic olefins, thermoplastic rubber, thermoplastic elastomer, EPDM, fluoroelastomers or thermoplastic vulcanizates (TPV), and flexible cast thermoset materials, such as urethanes or silicones. In general, various flexible thermoplastic elastomers that have suitable thermally durable behavior may be used. Some specific examples include SantoprenE® (Supplied by Exxon Mobil in Houston, Tex.), HipeX® (Supplied by Sivaco in Santa Clara, Calif.), Eflex® (Supplied by E-Polymers Co., Ltd. in Seoul, Korea), Enflex® (Supplied by Enplast Limited in Longford, Ireland), Excelink® (Supplied by JSR Corporation in Tokyo, Japan), Synoprene® (Supplied by Synoprene Polymers Pvt. Ltd. in Mumbai, India), and Elastron® (Supplied by Elastron Kimya in Kocaeli, Turkey). Some additional examples include nitrile butadiene rubber (e.g., Krynac®, available from Lanxess in Maharashtra, India; Nipol®, available from Zeon Chemicals in Louisville, Ky.; or Nysyn®, available from Copolymer Rubber & Chemicals in Baton Rouge, La.), hydrogenated nitrile butadiene rubber (e.g., Therban®, available from Lanxess in Maharashtra, India; Zetpol®, available from Zeon Chemicals in Louisville, Ky.), and tetra-fluoro-ethylene-propylene (e.g., Aflas®, available from Asahi Glass in Tokyo, Japan; Dyneon BRF®, available from 3M in St. Paul, Minn.; and Viton VTR®, available from DuPont Performance Polymers in Wilmington, Del.). In a particular embodiment, a portion of the electrical lead is encased in HipeX® material, which has thermal and mechanical characteristics suitable for photovoltaic applications. In certain embodiments, at least a portion of flexible insulating sheath 312 is formed by back side flexible sealing sheet 304 and/or by front side sealing sheet 303. These portions may be monolithic with other parts of these sealing sheets that seal the photovoltaic cells.

Connector body 306 is generally made from one or more rigid materials, such as polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), PVC, and weatherable engineering thermoplastics such as polyphenylene oxide (PPO), polymethyl methacrylate, polyphenylene (PPE), styrene-acrylonitrile (SAN), polystyrene and blends based on those materials. Furthermore, weatherable thermosetting polymers, such as unsaturated polyester (UP) and epoxy, may be used. Other examples include engineered polymers, which are specifically formulated to meet certain requirements specific for photovoltaic applications. For example, certain hybrid block co-polymers may be used. Rigidity may be needed to provide support to conductive elements 310 and to maintain mechanical connection with other connectors. For example, connector body 306 may have one or more interlocking features for maintaining mechanical attachment to another connector, as further explained below with reference to FIG. 4A.

Flexibility of arm 308 may be provided by using flexible materials and/or particular shapes for conductive lead 314 and insulating sheath 312. For example, flexible conductive lead 314 may be made from a flat conductive strip (e.g., a metal strip) that may have a width-to-thickness ratio of at least about 10. With reference to FIGS. 3A and 3B, the width of conductive lead 314 is defined as its dimension in the Y direction, while the thickness is defined as its cross-section dimension the Z direction and does not account for the overall height of the profile. Such a thin and wide conductive lead 314 will allow connector body 306 to move in at least the X and Z directions, at least with respect to interface 309 of flexible arm 308 and the supporting component of module 302. In other embodiments, flexible conductive lead 314 is made from a stranded wire, which has flexibility in all directions.

In certain embodiments, arm 308 may be specifically shaped to improve its flexibility in one or more directions and with respect to one or more axes, i.e., include shaped portion 307 as shown in FIGS. 3A and 3B. Shaped portion 307 may be also referred to as a stress relief portion. Shaped portion 307 is shown in FIGS. 3A and 3B as a square wave extending in the X direction and having a height in the Z direction. Other suitable shapes include a sinusoid, as a series of repeated waves or other bent features, and other similar shapes. In general, shaped portion 307 should allow one end of arm 308 to move with respect to its other end. In specific embodiments, these ends move at least in the X direction with respect to each other.

A profile of shaped portion 307 may be characterized based on its overall height calculated, for example, as a peak-to-peak vertical distance and extending in the Z direction. For example, a flat strip that is about 0.31 inches wide and 0.008 inches high may be shaped into waves that are 0.10 inches high. Shaped portion 307 that is between about 0.3 inches and 1.0 inches long may have 5 repeating waves. Other sizes of flexible arms are within the scope and may generally follow the same dimensional ratios as presented above.

Figure 3C:
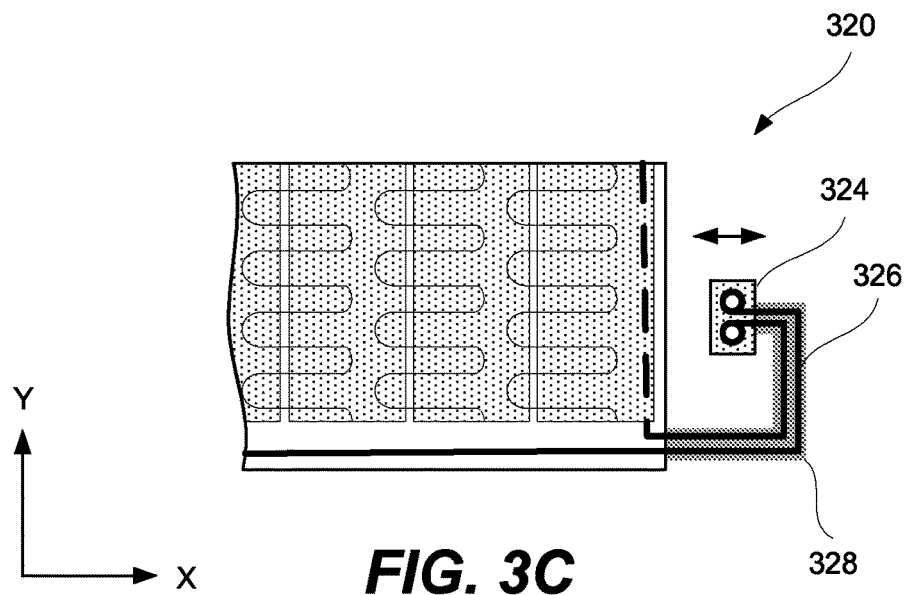
FIG. 3C is a top schematic view of a flexible module connector having one flexible arm forming a partial loop flexibly attaching the connector body to the sealing sheets, in accordance with certain embodiments.
Figure 3D:
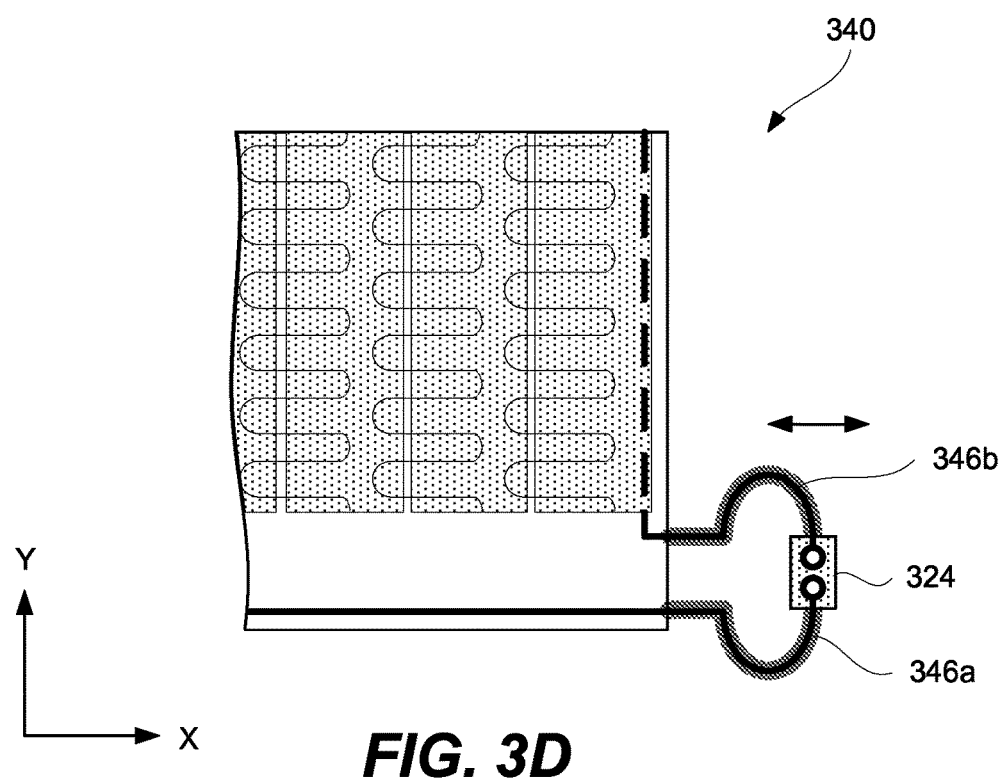
FIG. 3D is a top schematic view of a flexible module connector having two flexible arms forming a complete loop together with the connector body and flexibly attaching the connector body to the sealing sheets, in accordance with certain embodiments.

A flexible arm may also be shaped in other directions and planes. As a reference, the shape illustrated in FIGS. 3A and 3B may be referred to as a shape in the X-Z plane as these waves extend in the X direction and have a height in the Z direction. Similar curves, waves, loops, and bends, which are collectively referred to as shapes, may exist in the X-Y plane as shown in FIGS. 3C and 3D. For reference, the plane X-Y is substantially parallel to the sealing sheets.

FIG. 3C is a top schematic view of a flexible module connector 320 having one flexible arm 326 forming a partial loop within the plane substantially parallel to the sealing sheets, in accordance with certain embodiments. The shape of flexible arm 326 may be described as a C shape. The shape may have square corners as shown in FIG. 3C or have a round profile. The shape allows connector body 324 to move with respect to other parts of the module. For example, flexible arm 326 may bend in corner 328, thereby allowing connector body 324 to move in this and possibly other directions.

FIG. 3D is a top schematic view of a flexible module connector 340 having two flexible arms 346a and 346b both supporting connector body 324 and allowing connector body 324 to move with respect to the other parts of the module, in accordance with certain embodiments. Each of the two arms 346a and 346b may be shaped as partial loops. The shape of each loop may be described as a C shape. The shape may have square corners as shown in FIG. 3C or have a round profile as shown in FIG. 3D. Each arm may have its own conductive lead and insulating sheath.

Interlocking Features

Figure 4A:
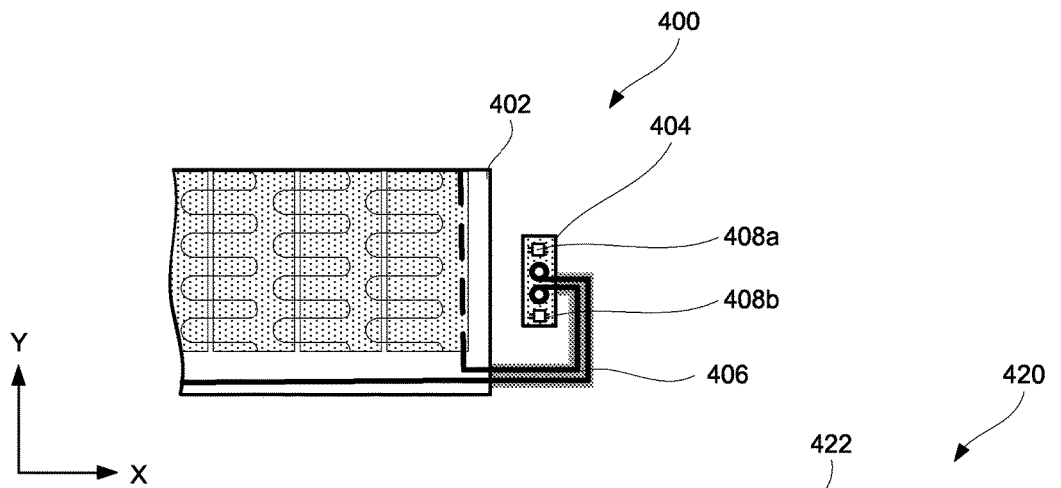
FIG. 4A is a top schematic view of a flexible module connector having mechanical interlocking features provided on its connector body, in accordance with certain embodiments.
Figure 4B:
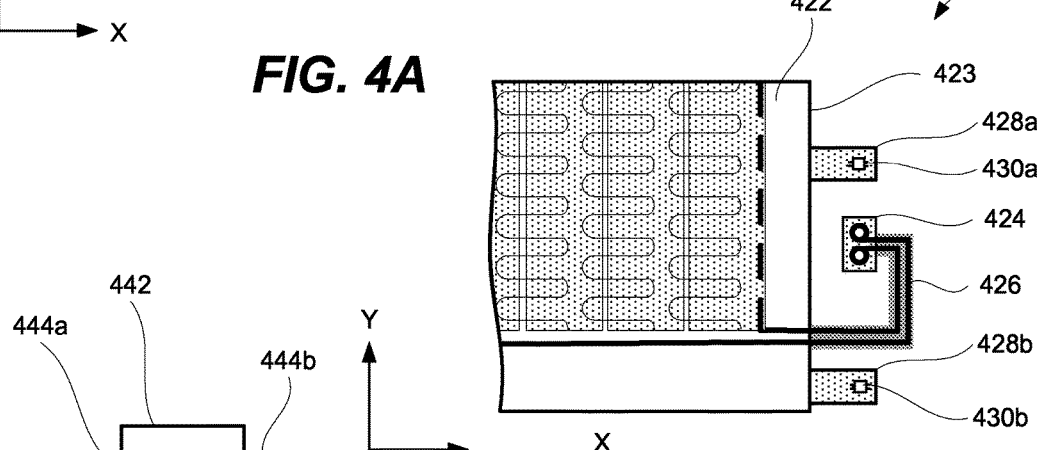
FIG. 4B is a top schematic view of a flexible module connector and two extensions independently attached to the sealing sheets, where the two extensions have mechanical interlocking features, in accordance with certain embodiments.

To maintain electrical connections with adjacent modules and other electrical components of the array during operation, a flexible photovoltaic module may have one or more interlocking features. The interlocking features may be provided on connector bodies (e.g., as shown in FIG. 4A) and/or on separate components attached to the same edge of the photovoltaic module as the module connector (e.g., as shown in FIG. 4B). These features may be generally referred to as mechanical interlocking features. In certain embodiments, one conductive element may interlock with another conductive element, which may be referred to as electrical interlocking features. Snap connectors are a specific example of electrical interlocking features. In certain embodiments, electrical interlocking features are used together with mechanical interlocking features.

Mechanical interlocking features may protrude from their supporting components, such as connector bodies. In certain embodiments, an entire connector body may be a part of the interlocking features. For example, a connector body may fit into a socket of another module connector and be locked in this cavity to prevent accidental disconnect. Examples of interlocking features include latches, threads, and various recess-protrusion combinations.

FIG. 4A is a top schematic view of flexible module connector 400 having mechanical interlocking features 408a and 408b positioned on connector body 404, in accordance with certain embodiments. In this design, connector body 404 is rigidly attached to another component (not shown) thereby preserving electrical connections between these components. For example, connector body can be rigidly attached to and supported with respect to a connector body of an adjacent flexible photovoltaic module. Even if flexible photovoltaic module 402 moves during installation or operation with respect to the adjacent connector body or other component to which connector body 404 is attached, the movement will not disconnect connector body 404 from this other component. Specifically, mechanical interlocking features 408a and 408b will maintain attachment to this other component, while flexibility arm 406 will reduce the mechanical stress exerted on connector body 404 while the rest of module 402 moves.

FIG. 4B is a top schematic view of another module connector 420 and supporting extensions 428a and 428b including mechanical interlocking features 430a and 430b, in accordance with certain embodiments. In this design, the entire edge 423 of module 422 is rigidly supported with respect to another component (e.g., another module) to which supporting extensions 428a and 428b and connector body 424 are attached. This rigid support reduces movement of connector body 424 with respect to this other component. Furthermore, since the entire edge 423 is supported and generally does not move with respect to this other component, arm 426 may not need to be flexible. The edge 423 may be further reinforced (e.g., to improve its rigidity) by various reinforcement structures, such as a header structure described above, edge seals, and others.

Figure 4C:
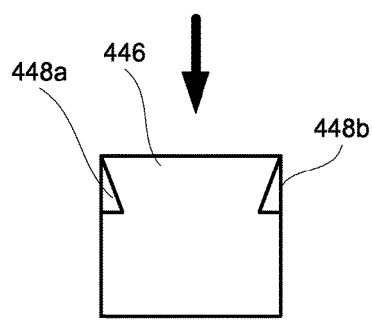
FIG. 4C is a side schematic view of mechanical interlocking features prior to engaging, in accordance with certain embodiments.

Various types of interlocking features may be used. FIG. 4C is a side schematic view of one such type. Protrusion 442 is a part of one module, such as its connector body. Cavity 446 is a part of another connecting component, such as another connector body of an adjacent module. Protrusion 442 is configured to fit into cavity 446 and interlock with cavity 446 during installation. Protrusion 442 may include one or more retention features 444a and 444b, which may be configured to engage with one or more corresponding retention features 448a and 448b of cavity 446. Retention features 444a and 444b and/or retention features 448a and 448b may bend when protrusion 442 is inserted into cavity 446.

Figure 5:
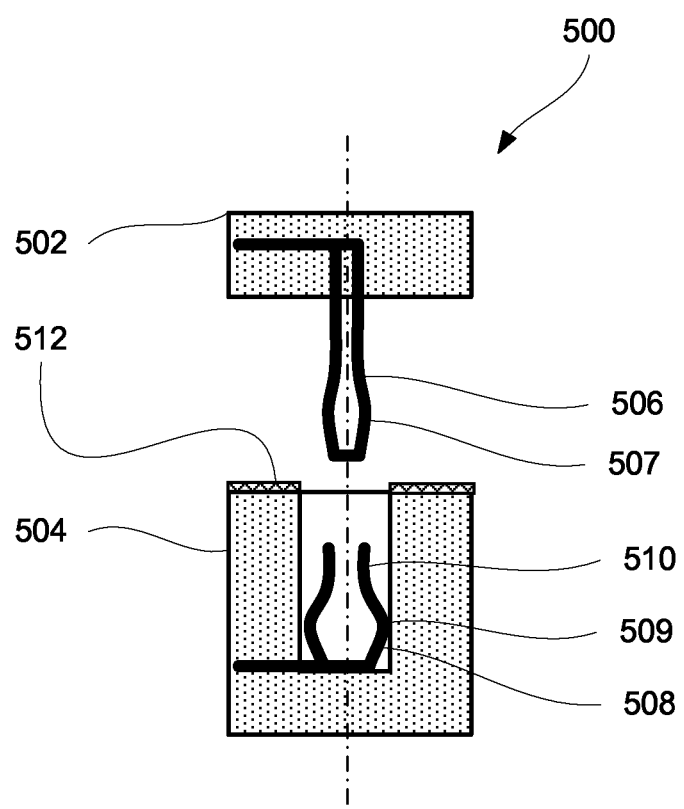
FIG. 5 is a side schematic view of interlocking conductive elements prior to engaging, in accordance with certain embodiments.

Electrical connections may be also maintained by providing interlocking conductive elements, in addition to or instead of mechanical interlocking features described above. FIG. 5 is a side schematic view of assembly 500 having interlocking conductive elements 506 and 508 prior to engaging these elements, in accordance with certain embodiments. During installation, conductive element 506 is inserted into conductive element 508 such that wider portion 507 of conductive element 506 is pushed through narrow neck 510 until it reaches wider cavity 509 of conductive element 508. Wider portion 507 and/or narrow neck 510 may be made from spring-like materials. Conductive elements 506 and 508 may be supported by various insulating components 502 and 504 (e.g., connector bodies). The interface between these insulating components 502 and 504 may include various seals 512, such as gaskets and adhesives. In certain embodiments, such sealing components may be also used to maintain the mechanical connection between the two insulating components.

Electrical Safety and Configuration Features

When photovoltaic cells of a module are exposed to light, these cells may apply voltage to various conductive components of the module. This may occur prior to or during installation of the module. If conductive elements of a module are connected to the cells, it may present some safety concerns. To address these concerns, conductive elements may be enclosed in insulating bodies that prevent accidental contact but still allow for establishing electrical connections with other conductive elements. However, such insulating bodies may result in very thick connector bodies (in the Z direction as shown in FIG. 1B). Excessive thickness of the connector bodies may cause tripping hazards when rooftops are used as walkways and/or difficulties with sealing adjacent modules.

In certain embodiments, one or more conductive elements of the module are disconnected from its photovoltaic cells prior to and during initial installation operations. For example, conductive elements may remain disconnected from the cells until these elements become inaccessible, such as when they become connected to other external electrical components. At some point during installation, these conductive elements are connected to the cells to provide a fully operational module. These connections between the cells and conductive elements may be established by installing or rearranging bridging connectors in a junction box provided in the module. The junction box may be made accessible after the module is physically installed on the supporting surface. In the same or other embodiments, connections between the cells and conductive elements may be established using an electronic control unit, which may respond to a certain signal to establish the connections. In certain embodiments, these electrical safety features may be a part of a module connector.

Prior to describing various embodiments of these electrical safety features, a few components will be defined. A photovoltaic cell lead is defined as a lead provided within a flexible photovoltaic module, one end of which is connected to the photovoltaic cells during fabrication of the module, while the other end extends into a junction box or an electronic control unit. This other end can remain electrically disconnected from a connector lead prior to installation of the module. A return line lead is similar to a photovoltaic cell lead in that one of its ends extends into a junction box or an electronic control unit and can remain electrically disconnected from a connector lead prior to installation of the module. However, unlike the photovoltaic cell lead, the return line lead is not connected to any photovoltaic cells. Instead, its other end may be connected to another connector lead or may extend into another junction box or electronic control unit. A connector lead is defined as a lead one end of which is connected to the conductive element of the module connector, while the other end extends into a junction box or an electronic control unit and can remain electrically disconnected from a photovoltaic cell lead prior to installation of the module.

Figure 6A:
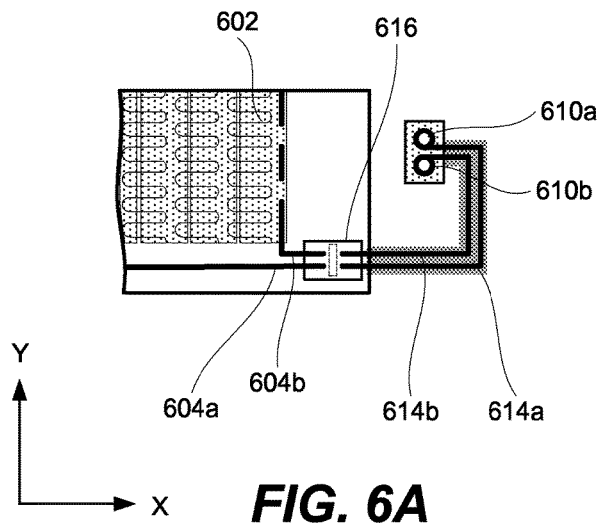
FIG. 6A is a schematic view of a junction box with a photovoltaic cell lead and return line lead extending into the junction box and being disconnected from the corresponding connector leads, in accordance with certain embodiments.

FIG. 6A is a schematic view of a junction box 616 with photovoltaic cell lead 604b and return line lead 604a disconnected from corresponding connector leads 614a and 614b, in accordance with certain embodiments. A flexible photovoltaic module may be manufactured in this configuration and may be kept in this configuration during handling and at least some initial installation operations. As such, even if photovoltaic cells 602 are exposed to light during handling and installation, the voltage will be applied to photovoltaic cell lead 604b but not to connector lead 614b. As a result, conductive element 610b may safely touched and remain exposed.

While return line lead 604a is not connected to photovoltaic cells 602 in this standalone module, it may be subjected to voltages when its other end is connected to another module and/or other electrical components of the photovoltaic array. Therefore, in certain embodiments, return line lead 604a is also kept disconnected from connector lead 614a and conductive element 610a, as shown in FIG. 6A. In other embodiments, one or more return line leads are connected to the corresponding connector lines during fabrication of the module and remain connected during installation. In such embodiments, this return line lead may not extend into a junction box or an electronic control unit.

Leads may remain disconnected while modules are installed on the rooftop and mechanical and electrical integration of modules and other electrical components is performed. In certain embodiments, lead lines are connected only after conductive elements are concealed and cannot be accidently touched by installers. Various connection schemes between these leads extending into a junction box or electronic control unit are possible, as will now be described with reference to FIGS. 6B and 6C.

Figure 6B:
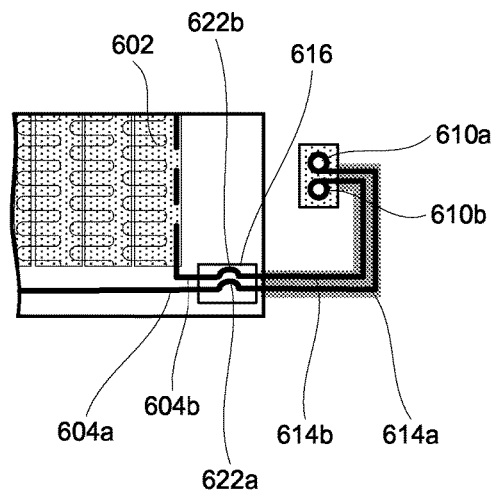
FIG. 6B is a schematic view of a junction box having a photovoltaic cell lead and return line lead being interconnected with the corresponding connector leads, in accordance with certain embodiments.

FIG. 6B is a schematic view of junction box 616 after photovoltaic cell lead 604b has been interconnected with connector lead 614b and return line lead 604a has been interconnected with connector lead 614a, in accordance with certain embodiments. Bridging connectors 622a and 622b have been added to junction box 616 to provide these electrical connections. In certain embodiments, bridging connectors 622a and 622b are integrated into a single physical component, which, for example, may be plugged into a socket provided in junction box 616. In certain embodiments, bridging connectors 622a and 622b are provided in junction box 616 at the time of fabricating the module, but these connectors are oriented such that no electrical connections are formed between photovoltaic cell lead 604b and connector lead 614b and between return line lead 604a and connector lead 614a. In these embodiments, to establish electrical connections, bridging connectors 622a and 622b may be reoriented in junction box 616 to provide these new electrical connections. For example, a component supporting bridging connectors 622a and 622b may be turned in its socket to a new position.

Once photovoltaic cell lead 604b is interconnected with connector lead 614b, the voltage of photovoltaic cells 602 is provided at conductive element 610b. In a similar manner, connecting return line lead 604a to connector lead 614a forms electrical communication between the return line (and any electrical components connected to another end of the return line) and conductive element 610a.

Prior to forming electrical connections shown in FIG. 6B, conductive elements 610a and 610b may be connected to other conductive elements, such as conductive elements of another module connector or conductive elements of a jumper connector. For purposes of this document, a jumper connector is defined as a component that electrically interconnects two or more conductive elements of the same module connector. For example, multiple flexible photovoltaic modules may be interconnected in series forming a string of interconnected modules. Two modules in this string represent end modules and are connected to only one other module in the string. All other modules are connected to two other (e.g., adjacent) modules in the string. One end module may be connected to an inverter or some other electrical component of the array. Another end module may have its return line interconnected with photovoltaic cells at its end that is not connected to another module. Sometimes this interconnection is performed by attaching a jumper connector to this end or, more specifically, to a module connector at this free end.

Figure 6C:
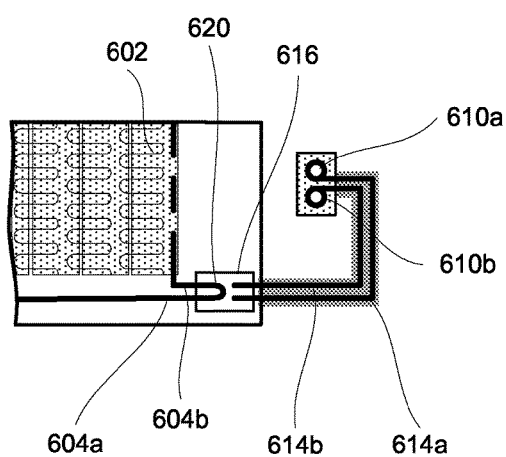
FIG. 6C is a schematic view of a junction box having a photovoltaic cell lead interconnected with a return line lead such that both of the leads are disconnected from the corresponding connector leads, in accordance with certain embodiments.

In other embodiments, this interconnection between return line lead and photovoltaic cell lead can be made in a junction box or electronic control unit without using a separate jumper connector. Specifically, FIG. 6C illustrates a junction box 616 having bridging connector 620 positioned with the junction box 616 and interconnecting photovoltaic cell lead 604b and return line lead 604a, in accordance with certain embodiments. In these embodiments, connector leads 614a and 614b and conductive elements 610a and 610b are not involved, and there is no need to attach a separate external jumper connecter to these elements. Bridging connector 620 effectively acts as an internal jumper connector.

In certain embodiments, a flexible photovoltaic module includes an electronic control unit configured to establish an electrical connection between a conductive element of the module connector and one or more photovoltaic cells at some point during installation. For example, the control unit may keep the conductive element disconnected from the one or more photovoltaic cells until a predetermined signal is received during installation. Once the signal is received, the connection is provided. The signal may be supplied wirelessly or though already established electrical connections in the module. The electrical connections established by the electronic control unit may be similar to the ones described above with reference to FIGS. 6A-6C. For example, a control unit that may positioned instead of junction box 616 with leads 604a, 604b, 614a, and 614b extending into the control unit. Depending on the signal provided into the control unit, these leads may remain disconnected as shown in FIG. 6A or connected according to schemes shown in FIGS. 6B and 6C.

Multiple Flexible Photovoltaic Modules Arranged into a Prefabricated Assembly

When multiple flexible photovoltaic modules are positioned on the same rooftop, these modules are electrically connected to each other and/or other electrical components of the array. A module may need to be sealed at its interface with the rooftop and, in certain embodiments, at its interfaces with adjacent modules modules to prevent water and other contaminant from getting under the module. Electrical connections and sealing are very labor intensive processes when performed in the field. Furthermore, electrical connections and/or seals established in the field may not be as robust as connections and/or seals provided during fabrication of the modules.

In certain embodiments, multiple flexible photovoltaic modules are integrated into a flexible photovoltaic assembly during their fabrication, for example, as a continuous web including two or more flexible photovoltaic modules. This assembly may be then separated in the field into two or more subassemblies, where each subassembly includes one or more modules. Furthermore, the flexible photovoltaic assembly and/or subassemblies made from these assemblies may be integrated in the field with other assemblies, subassemblies, and individual modules.

Figure 7:
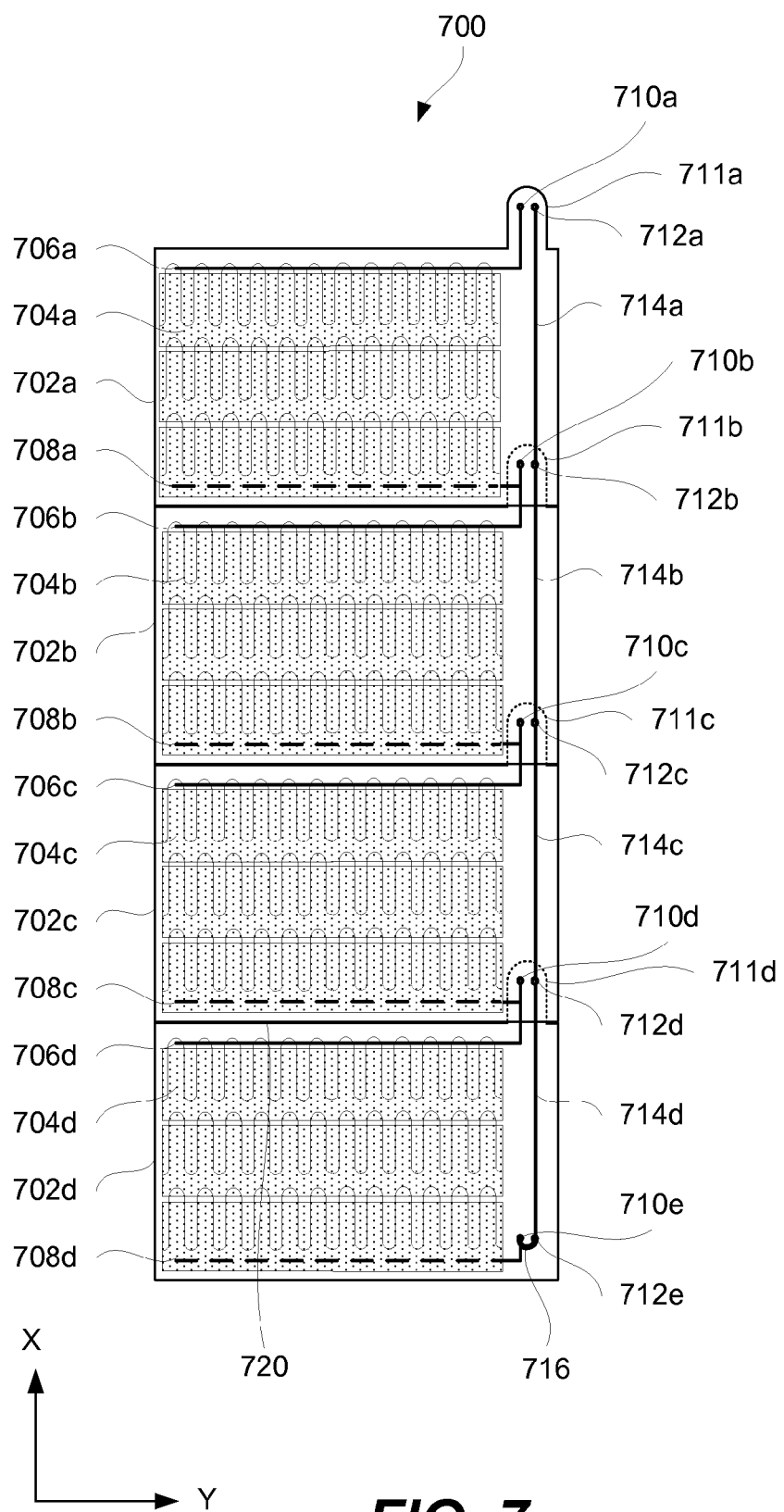
FIG. 7 is a top schematic view of a flexible photovoltaic assembly having four flexible photovoltaic modules, in accordance with certain embodiments.

FIG. 7 is a top schematic view of flexible photovoltaic assembly 700 having four flexible photovoltaic modules 702a-702d, in accordance with certain embodiments. These four modules 702a-702d are arranged into a single row. However, it should be understood that multiple rows of modules may be integrated into the same web to form an assembly. For example, an assembly may include two, three, four, and an even greater number of rows. This number may be determined by dimensions of individual modules, a width of the web, and the capabilities of processing and installation equipment. If multiple rows are used, the interface between two adjacent rows may allow for separate (e.g., cut) modules positioned in different row similar to interface 720, as further described below. Furthermore, modules in different rows may be interconnected.

Each photovoltaic module 702a-702d in assembly 700 may include one or more photovoltaic cells 704a-704d, which may be interconnected in parallel, in series, or various combinations of these two interconnection schemes. Each module 702a-702d may have multiple electrical leads connected to its photovoltaic cells. For clarity, FIG. 7 illustrates an example in which each module has two only electrical leads (i.e., module 702a has leads 706a and 708a, module 702b has leads 706b and 708b, module 702c has leads 706c and 708c, and module 702d has leads 706d and 708d). These electrical leads may be interconnected during fabrication of flexible photovoltaic assembly 700 to provide various connection schemes between these modules. In the example presented in FIG. 7, modules 702a-702d are interconnected in series (i.e., lead 708a is electrically connected to lead 706b through their conductive elements represented by point 710b, lead 708b is electrically connected to lead 706c through their conductive elements represented by point 710c, and lead 708c is electrically connected to lead 706d through their conductive elements represented by point 710d). As such, conductive elements 710a and 710e represent the overall connection of this four module set.

To provide such electrical ends within the same module connector, flexible photovoltaic modules 702a-702d include return lines 714a-714b. Similar to photovoltaic cells 704a-704d, return lines 714a-714b are interconnected (i.e., return line 714a is connected to return line 714b through their conductive elements represented by point 712b, return line 714b is connected to return line 714c through their conductive elements represented by point 712c, and return line 714c is connected to return line 714d through their conductive elements represented by point 712d). Furthermore, conductive elements 710e and 712e are interconnected using a bridging connector 716. Therefore, conductive elements 710a and 712a also represent the electrical ends of this four module string and flexible photovoltaic assembly 700. One having ordinary skill in the art would understand that other connection schemes are possible within flexible photovoltaic assembly 700.

Each pair of adjacent flexible photovoltaic modules 702a-702d has an interface, such as interface 720 between modules 702c and 702d, which may be sealed during fabrication of flexible photovoltaic assembly 700. Sealing may be provided by welding together the front side sealing sheets and/or back side sealing sheets of two adjacent modules or using monolithic front side sealing sheets and/or monolithic back side sealing sheets for the entire flexible photovoltaic assembly 700. In certain embodiments, flap portions 711b-711d of modules 702b-702d may be separable from corresponding modules 702a-702c, to which these flaps may be temporarily attached during fabrication of flexible photovoltaic assembly 700. The separation of the flaps may be used to disconnect corresponding lines and leads of adjacent modules in order, for example, to cut through the interface.

One or more modules may be separated from flexible photovoltaic assembly 700 in the field, which involves electrical and mechanical separation. For example, an array may fit only three modules, meaning that one module (e.g., module 702d) needs to be separated and removed from assembly 700. Mechanical separation may involve cutting through the front side sealing sheet and/or back side sealing sheet at interface 720 or within some designated area along this interface. As such, interface 720 may include a cut-off area. In certain embodiments, the cut-off area has a width of between about 0.5 inches and 10 inches or, more specifically, between about 1 inch and 5 inches or, even more specifically, between about 1 inch and 2 inches. The cut-off area may be provided in between two sealing areas of the adjacent modules. In certain embodiments, the width of each sealing area is between about 0.125 inches and 2 inches or, more specifically between about 0.25 inches and 1 inch or, even more specifically, between about 0.5 inches and 1 inch. The sealing area remains intact when the adjacent cut-off area is cut during separation of one or more modules from the assembly.

The cut-off area may be identified on the front side sheet with two line markings extending across the row of the panels or, more specifically, across the web. An installer can separate two modules along any line that falls in between the two markings. For example, two line markings may be printed using an online inkjet printer. Alternatively, sealing seams may be used as identifiers of the cut-off area. Furthermore, an installer may rely on internal components of modules that are visible through the transparent front side sheet to identify the cut-off area.

In certain embodiments, module connectors of individual modules are specifically configured to prevent electrical shorts when two adjacent modules are being separated during installation. For example, an installer may decide to cut assembly 700 at interface 720 while at least some modules in this assembly are exposed to light. Often cutting is performed with sharp metal tools, such as a utility knife and/or a saw blade. The electrical lines (e.g., bus wires) connected to conductive elements 710a-710e and 712a-712e may be spaced apart by a predetermined distance such that the two wires cannot be shorted by cutting tools during the installation. For example, the distance may be at least about 2 inches.

In certain embodiments, electrical separation may involve disconnecting conductive elements of module 702d from conductive elements of module 702c, represented by points 710d and 712d in FIG. 7. Flap 711d supporting conductive elements of module 702d may be moved away from interface 720 to avoid cutting through flap 711d or, more specifically, through electrical leads within flap 711d. Once conductive elements of module 702c are disconnected, a bridging connector (similar to bridging connector 716 shown in FIG. 7) may be used to interconnect these conductive elements.

Flexible photovoltaic assembly 700 may also include bypass diodes, inverters, direct current to direct current (DC/DC) converters, and/or various combinations of these components (not shown in FIG. 7). A typical bypass diode is configured to prevent an electrical current from flowing back into the cells connected to the diode that are not generating electrical power (for example, due to shading, cell failure, and other reasons). An electrical resistance of the shaded cells is greater than that of the bypass diode. As such, the electrical current will mostly pass ("shunted") through the diode instead of passing through the cells. Each photovoltaic cell may have a dedicated bypass diode or a group of cells may share one diode.

Furthermore, one or more DC/DC converters may be integrated into assembly 700. A DC/DC converter may be associated with one photovoltaic module or a set of modules. The DC/DC converter converts an input DC voltage into a higher or lower DC voltage level required by, for example, a central inverter. The central inverter may also be a part of the assembly and be connected to a grid or other AC electrical systems. For example, several DC/DC converters can be connected to the central inverter by module connectors described above. The DC/DC converters allow each module (or each set of modules) to operate at its optimum current/voltage regime. In certain embodiments, a roll includes a buck converter connected to a boost converter.

Conclusion

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A flexible photovoltaic module comprising:
   a front side flexible sealing sheet;
   a back side flexible sealing sheet;
   a sealed space formed between and at least partially bounded by the front side flexible sealing sheet and the back side flexible sealing sheet;
   one or more flexible photovoltaic cells positioned in the sealed space; and
   a first module connector comprising a flexible arm and a connector body, the connector body comprising a first conductive element and a second conductive element that are electrically uncoupled to each other in the first module connector, the flexible arm comprising a first flexible conductive lead electrically connected to the first conductive element, a second flexible conductive lead electrically connected to the second conductive element, a first end, and a second end, wherein:
      the first end of the flexible arm is directly flexibly attached to one of: the front side flexible sealing sheet and the back side flexible sealing sheet,
      the second end of the flexible arm is connected to the connector body,
      the first conductive element is electrically connected to the one or more flexible photovoltaic cells positioned in the sealed space, and
      the second conductive element is electrically connected to one of: the one or more flexible photovoltaic cells in the sealed space and a return line.

2. The flexible photovoltaic module of claim 1, wherein the connector body extends outside of an edge formed by the back side flexible sealing sheet in a direction substantially parallel to the back side flexible sealing sheet.

3. The flexible photovoltaic module of claim 1, wherein the flexible arm allows the connector body to move with respect to the front side flexible sealing sheet in a direction substantially parallel to the back side flexible sealing sheet.

4. The flexible photovoltaic module of claim 1, wherein the flexible arm allows the connector body to move in a direction substantially perpendicular to the back side flexible sealing sheet.

5. The flexible photovoltaic module of claim 1, wherein the flexible arm is removable from the back side flexible sealing sheet.

6. The flexible photovoltaic module of claim 1, wherein the flexible arm is configured to maintain a position of the connector body with respect to the back side flexible sealing sheet up until a first minimum force is applied to the connector body, wherein the first minimum force moves the connector body from the position.

7. The flexible photovoltaic module of claim 1, wherein:
the flexible arm comprises a first conductive lead electrically connected to the first conductive element and a second conductive lead electrically connected to the second conductive element, and
the first conductive element and the second conductive element are insulated by a flexible insulating sheath.

8. The flexible photovoltaic module of claim 7, wherein at least a portion of the flexible insulating sheath is formed by the back side flexible sealing sheet.

9. The flexible photovoltaic module of claim 1, wherein the flexible arm has a shaped portion configured to provide flexibility to the flexible arm between the connector body and the back side sealing sheet.

10. The flexible photovoltaic module of claim 1, wherein the flexible arm forms a partial loop within a plane substantially parallel to the back side sealing sheet.

11. The flexible photovoltaic module of claim 1, further comprising an additional flexible arm forming a complete loop together with the flexible arm and the connector body within a plane substantially parallel to the back side sealing sheet.

12. The flexible photovoltaic module of claim 1, wherein the connector body comprises one or more interlocking features for engaging with one or more corresponding interlocking features of another connector during installation of the flexible photovoltaic module.

13. The flexible photovoltaic module of claim 1, wherein the first conductive element of the connector body comprises interlocking features for engaging with one or more corresponding interlocking features of another conductive element during installation of the flexible photovoltaic module.

14. The flexible photovoltaic module of claim 1, wherein the conductive element is provided within a cavity of the connector body, the cavity extending substantially perpendicular to the back side sealing sheet.

15. The flexible photovoltaic module of claim 1, wherein the front side sealing sheet comprises a header structure attached to a front side sealing sheet edge for protecting and sealing the edge; and
wherein the flexible arm is attached to the header structure.

16. The flexible photovoltaic module of claim 15, wherein the header structure encloses the front side sealing sheet edge and a back side sealing sheet edge.

17. The flexible photovoltaic module of claim 1, wherein the first end of the flexible arm is directly flexibly attached after installation of the flexible photovoltaic module.

18. The flexible photovoltaic module of claim 1, wherein the flexible arm is directly flexibly attached to the front side flexible sealing sheet.

19. The flexible photovoltaic module of claim 1, wherein the flexible arm is directly flexibly attached to the back side flexible sealing sheet.

* * * * *